US006426172B1

(12) United States Patent
Gisser et al.

(10) Patent No.: US 6,426,172 B1
(45) Date of Patent: Jul. 30, 2002

(54) METHOD OF PROCESSING MOTION PICTURE PRINT FILM TO PROVIDE IMPROVED LASER SUBTITLING PERFORMANCE, AND PROCESSED MOTION PICTURE PRINT FILM

(75) Inventors: Kathleen R. Gisser, Pittsford; Diane E. Kestner, Hilton, both of NY (US); Alain M. Enon, En Boussoy (FR)

(73) Assignee: Eastman Kodak Company, Rochester, NY (US)

( * ) Notice: Subject to any disclaimer, the term of this patent is extended or adjusted under 35 U.S.C. 154(b) by 18 days.

(21) Appl. No.: 09/751,723

(22) Filed: Dec. 29, 2000

(51) Int. Cl.$^7$ .................................................. G03F 7/26

(52) U.S. Cl. ............. 430/296; 430/270.12; 430/270.14; 430/295; 430/934; 430/942; 430/945

(58) Field of Search ....................... 430/270.12, 270.14, 430/295, 296, 934, 942, 945

(56) References Cited

U.S. PATENT DOCUMENTS 4,854,696 A 8/1989 Guez ........................... 352/90
5,367,348 A 11/1994 Nachmanson et al. ........ 352/90
5,795,703 A * 8/1998 Ishikawa .................... 430/393
5,981,155 A 11/1999 Vercruysse et al. ......... 430/507
5,985,529 A * 11/1999 Bogdanowicz et al. ..... 430/502

OTHER PUBLICATIONS

American Cinematographer; Reflections: The Lab, Part II; by Benjamin Bergery; May 1993; pp. 74–78.

* cited by examiner

*Primary Examiner*—Hoa Van Le
(74) *Attorney, Agent, or Firm*—Andrew J. Anderson

(57) ABSTRACT

A method for processing and laser ablation marking an imagewise exposed motion picture photographic film element which comprises a support having on a front side thereof one or more image-forming units comprising at least one light-sensitive silver halide emulsion layer is described, comprising processing the film to provide a developed photographic image with at least 100 mg/m$^2$ of retained silver halide, and subsequently laser ablation marking the film to selectively ablate portions of the image forming units from the support.

12 Claims, No Drawings

METHOD OF PROCESSING MOTION PICTURE PRINT FILM TO PROVIDE IMPROVED LASER SUBTITLING PERFORMANCE, AND PROCESSED MOTION PICTURE PRINT FILM

FIELD OF THE INVENTION

The present invention relates in general to photography and in particular to a novel processed motion picture print film photographic element. More specifically, this invention relates to a motion picture print film which is processed after exposure thereof to result in a retained silver halide level of at least 100 mg/$M^2$, which processed print film is capable of being marked with a laser with improved performance.

BACKGROUND OF THE INVENTION

Marking of photographic film elements to provide, e.g., graphic elements, characters, bar codes or text is often desired in the photographic art. The showing of foreign language films in a motion picture theater, e.g., typically includes the simultaneous display of the translated dialogue in the form of marked subtitles along with display of the film scenes. A current frequently used method of subtitle marking, described in U.S. Pat. Nos. 4,854,696 and 5,367,348, involves embossing or etching the subtitle text into the film's photographic emulsion image layer(s), after imagewise exposure of the film scenes and photographic processing to develop the imagewise exposed scenes. Marking is currently frequently done by laser ablation, wherein a laser beam of high energy travels along a determined path corresponding to the inscriptions to be formed on the film element. The majority of laser subtitling labs use an Argon laser with peak emissions at 488 and 514 nm. In such method, the photographic emulsion layer(s) coated onto the film support becomes ablated locally. Photographic color films comprise image dye-forming emulsion layers coated on a transparent support, and the marked or ablated areas comprise clear or low density areas surrounded by the unmarked dye-containing image areas. Similarly, for black and white films the marked or ablated areas comprise clear or low density areas surrounded by the unmarked image areas which contain silver metal. In the particular application of laser subtitling of photographic films, the quality of laser marked subtitles is dependent upon the density and color differences between the marks and the surrounding dye or silver image areas, and on the wavelength, power, and writing speed of the laser. The power and speed are selected to remove as much of image emulsion layers as possible without damaging or distorting the support. Laser subtitling is typically performed on the final color or black and white release print film intended for projection in a theater, but may also be performed on color intermediate or black and white films to form subtitle images which may then be optically printed onto another intermediate or black and white film to form a negative image, which may then be printed onto the final release print film.

Most laser subtitling systems were originally designed and optimized for marking motion picture films having acetate film base supports. A switch in the industry from acetate to polyester supports for motion picture print films has required the subtitling labs to make changes in their operations to reoptimize results, which has been a problem as thermoplastic polymer support materials, such as polyester, are more succeptible to support damage. There is an inherent conflict between using sufficient power to mark in low density image areas without causing significant base damage in the high density image areas, as due to the non-uniform release of gelatinous residues or to the damage of the support, undesired dark and/or colored spots may be observed when the film image is enlarged and projected on the screen in a theater, especially for print films having polyester film supports.

After imagewise (scene) exposure, silver halide motion picture photographic elements are typically processed using standard photographic processing procedures, such as Process ECP-2B for color print films, standard D-97 processing for black and white films, and ECN-2 for color negative and intermediate films. In such standard processes, residual (or retained) silver halide is typically minimized after image development to prevent the appearance of the developed image from changing, as such residual silver halide may be slowly photoreduced to silver metal. Silver salts are typically removed in a "fix" step or steps, wherein they are solubilized by complexation with a silver ligand. Where silver metal formed during image development is also desired to be removed (typically for color films where the image is formed with dyes), it is oxidized and converted back to a silver salt in a "bleach" step (optionally with a bleach accelerator), and then removed in a fix step. Alternatively, the bleach and fix may becomed into a single bleach-fix or "blix" step. Standard process ECP-2B for color print films, e.g., comprises prebath (10"), water rinse (20"), color developer (3'), stop bath (40"), first wash (40"), first fix (40"), second wash (40"), bleach (1'), third wash (40"), second fix (40"), fourth wash (1'), and final rinse (10") steps, and then drying with hot air. Typical levels of retained silver in normally processed color print films in areas of high density are less than 150 mg/$m^2$, and the typical level of retained silver halide in normally processed films is less than 50 mg/$m^2$.

It would be desirable to provide a method for photographic processing and laser marking an imagewise exposed motion picture photographic film element in order to provide improved performance when the processed photographic film is marked by means of a laser beam.

SUMMARY OF THE INVENTION

In accordance with the present invention there is provided a method for processing and laser ablation marking an imagewise exposed motion picture photographic film element which comprises a support having on a front side thereof one or more image-forming units comprising at least one light-sensitive silver halide emulsion layer, comprising processing the film to provide a developed photographic image with at least 100 mg/$m^2$ of retained silver halide, and subsequently laser ablation marking the film to selectively ablate portions of the image forming units from the support.

DETAILED DESCRIPTION OF THE INVENTION

Motion picture film photographic elements processed in accordance with the invention comprise a support having on a front side thereof at least one silver halide emulsion layer. In preferred embodiments, the elements may include an antihalation undercoat in a subbing layer unit between the support and the silver halide emulsion layer(s), an outermost protective overcoat layer, an antistatic layer on either side of the support, and an outermost protective backcoat layer on the back side of the support.

While standard photographic processing is designed to minimize levels of retained silver halide in a processed photographic film, motion picture films are deliberately processed in accordance with the invention to result in a developed photographic image with at least 100 mg/m$^2$ of retained silver halide, preferably from 100 to 1000 mg/m$^2$, more preferably from 100 to 500 mg/m$^2$ and most preferably from 100 to 250 mg/m$^2$ of retained silver halide. Such levels of retained silver halide have surprisingly been found to result in improved performance when the processed films are subsequently laser ablation marked to selectively ablate portions of the image forming units from the support. Retained silver halide levels of less than 100 mg/m$^2$ have little impact on laser ablation marking performance, while levels above 1000 mg/m$^2$, may adversely effect minimum density and hues of the developed images. The most preferred range of 100 to 250 mg/m$^2$ of retained silver halide provides optimum laser marking performance while minimizing impact on minimum density and hues of the developed images.

Special image processing techniques are known in the art which are designed to specifically retain a significant amount of silver metal (e.g., greater than 100 mg/m$^2$, or even greater than 500 mg/m$^2$) during the processing of color photographic silver halide print materials, such as by-passing the bleach step present in normal print processing so as to retain developed silver (see, e.g., B. Bergery, "Reflections: The Lab, Part II", American Cinematographer, May 1993, pp. 74–78). The retained silver increases print opacity yielding higher black densities, with an accompanying decrease in color saturation. While the primary affect of this process is to leave silver in the film, some amount of silver halide also remains. The advantages of the invention attributable to retained silver halide, however, may be achieved in the absence of increased levels of retained silver metal, and laser subtitling results may in fact actually be better at lower retained silver metal levels. Accordingly, in preferred embodiments of the invention directed towards color print films, the retained silver metal after photographic processing is preferably less than 500 mg/m$^2$, and more preferably less than 100 mg/m$^2$.

Residual silver halide levels in accordance with the invention may be obtained by modifying standard photographic processing procedures. For example, fix solution steps may be skipped or shortened. Alternatively, higher retained silver halide levels may be achieved through other process variations, including lowering the temperature of the fixing solution or decreasing the amount of the active ingredient in the fix (e.g., sodium or ammonium thiosulfate), or adjusting the pH of the fixing solution. A high degree of regeneration or build-up of halide in the fix may also be used to reduce the activity of the fixer. Retained silver metal in combination with retained silver halide may be obtained, e.g., by skipping or reducing the time in either the bleach or the bleach accelerator solutions steps during processing, reducing the temperature of such solutions, reducing the concentration of bleach accelerator in an accelerator bath (where a two-part bleach solution is used) or the concentration of the active bleaching species in the bleach solution, adjusting the pH of the accelerator or bleach solution, or contaminating the bleach accelerator with thiosulfate or any other contaminant that deactivates the bleach.

The materials employed as the support member are synthetic high molecular weight polymeric materials. These materials may be comprised of various polymeric films, but polyester and cellulose triacetate film supports, which are well known in the art, are preferred. The advantages of the invention are particularly applicable when thermoplastic polymer supports, particularly polyester film supports such as poly(ethylene terephthalate), are used. For elements comprising acetate supports, processing to retain silver halide in accordance with the invention may advantageously allow good subtitling results to be obtained with lower power settings than previously required. The thickness of the support is not critical. Conventional support member thicknesses of from about 50 to 250 microns (2 to 10 mils, or 0.002 to 0.010 inches) can be employed, for example, with very satisfactory results.

The term "subbing layer unit" as used herein applies to layers of the photographic element coated between the support and the photographic emulsion layer closest to the support. Subbing layers coated between a support and the photographic imaging emulsion layers of a photographic element are conventionally employed in the art to provide improved adhesion of the imaging layers to the support, as well as other functionality such as antihalation or antistatic protection. As described in U.S. Pat. No. 4,132,552, e.g., it is often useful to employ a combination in the subbing layer unit of at least one hydrophobic "primer" layer directly contacting the film support and at least one hydrophilic layer coated thereupon. Polyester support members, e.g., typically employ a primer layer between the functional layers and the polyester support. Such primer layers are well known in the art and comprise, for example, a vinylidene chloride/methyl acrylate/itaconic acid terpolymer or vinylidene chloride/acrylonitrile/acrylic acid terpolymer as described in U.S. Pat. Nos. 2,627,088; 2,698,235; 2,698,240; 2,943,937; 3,143,421; 3,201,249; 3,271,178 and 3,501,301. Additional polymers useful as primer layers in a subbing layer unit include styrene-butadiene copolymers, water-soluble polyesters and polyacrylic esters.

The hydrophilic layer which may be coated adjacent to the primer layer in a subbing layer unit preferably comprises a hydrophilic colloid to provide good adhesion to hydrophilic colloid layers coated thereover, and may also include an aqueous latex dispersion, optionally containing a cross-linking agent, a swelling agent, a matting agent or an antistatic agent. Hydrophilic colloids such as dextran, polyacrylamide, polyvinylalcohol and polyvinyl pyrrolidone may be used, but particularly preferred is gelatin, optionally in combination with at least one of the other hydrophilic colloids cited. Preferably hydrophilic layers are gelatinous layers. The gelatin used therein can be lime-treated or acid-treated gelatin. The preparation of such gelatin types has been described in e.g. "The Science and Technology of Gelatin", edited by A. G. Ward and A. Courts, Academic Press 1977, page 295 and next pages. The gelatin can also be an enzyme-treated gelatin as described in Bull. Soc. Sci. Phot. Japan, No. 16, page 30 (1966). Gelatin derivatives may be useful. Said derivatives have e.g. been described in U.S. Pat. Nos. 4,978,607; 5,378,598; 5,395,748 and 5,439,791 and in EP-A's 0 628 860 and 0 666 498. Examples of the cross-linking (or hardening) agent include triazine compounds as described e.g. in U.S. Pat. Nos. 3,325,287; 3,288,775 and 3,549,377; dialdehyde compounds as described in U.S. Pat. Nos. 3,291,624 and 3,232,764; epoxy compounds as described in U.S. Pat. No. 3,091,537; vinyl compounds described in U.S. Pat. No. 3,642,486; aziride compounds described in U.S. Pat. No. 3,392,024; ethyleneimine compounds described in U.S. Pat. No. 3,549,378 and methylol compounds. Combinations of vinyl sulphonyl compounds and triazine compounds may be useful and particularly the combination set forth in U.S. Pat. No. 4,680,257.

Elements processed in accordance with the invention comprise one or more image-forming units comprising at least one light-sensitive silver halide emulsion layer coated on the element support. The invention is applicable to processing of color photographic print and intermediate film elements as well as black and white motion picture photographic film elements. While a single silver halide emulsion layer may typically be used in a black and white film element, a color photographic print or intermediate element will typically contain dye image-forming units sensitive to each of the three primary regions of the spectrum, in the form of a blue-sensitive layer having a yellow color coupler associated therewith, a green-sensitive layer having a magenta color coupler associated therewith, and a red-sensitive layer having a cyan color coupler associated therewith (i.e., separate yellow, magenta, and cyan dye image-forming units). Each unit may be comprised of a single light-sensitive layer, a pack of two light-sensitive layers with one being more light sensitive and the other being less light-sensitive, or a pack of three or more light-sensitive layers of varying light-sensitivity. The layers of the element, including the layers of the image-forming units, can be arranged in various orders as is well known in the art.

A multicolor photographic print film element which may be processed in accordance with preferred embodiments of the invention comprises a support bearing, in order, a yellow dye image-forming unit comprising at least one blue-sensitive silver halide emulsion layer having associated therewith at least one yellow dye-forming coupler, optionally a first emulsion intercoat layer, a cyan dye image-forming unit comprised of at least one red-sensitive silver halide emulsion layer having associated therewith at least one cyan dye-forming coupler, optionally a second emulsion intercoat layer, and a magenta dye image-forming unit comprising at least one green-sensitive silver halide emulsion layer having associated therewith at least one magenta dye-forming coupler.

The silver halide emulsion layers of dye-image forming units and the emulsion intercoat layers will comprise a hydrophilic binder, typically gelatin. The intercoat layers positioned between adjacent dye image-forming units of photographic elements function to separate and prevent image spread between the adjacent image-forming units.

While processing of an element to result in at least 100 $mg/m^2$ of retained silver halide in accordance with the invention advantageously leads to improved laser ablation marking performance, it is contemplated that laser ablation marking may be further improved by incorporating dispersed carbon particles into the layers coated on the emulsion side of the support as described in copending, commonly assigned U.S. Ser. No. 09/631,917 filed Aug. 3, 2000, the disclosure of which is incorporated by reference herein. Specifically, such elements may comprise in total from 5 to 30 $mg/m^2$ of dispersed carbon particles, preferably at least 6 $mg/m^2$, and preferably at most 22 $mg/m^2$ and most preferably at most 20 $mg/m^2$, where the majority of the dispersed carbon particles is contained in the emulsion layers and emulsion intercoat layers.

The light-sensitive silver halide emulsions employed in the emulsion layers of the photographic elements processed in accordance with the invention can include coarse, regular or fine grain silver halide crystals or mixtures thereof and can be comprised of such silver halides as silver chloride, silver bromide, silver bromoiodide, silver chlorobromide, silver chloroiodide, silver chorobromoiodide, and mixtures thereof. The emulsions can be, for example, tabular grain light-sensitive silver halide emulsions. The emulsions can be negative-working or direct positive emulsions. They can form latent images predominantly on the surface of the silver halide grains or in the interior of the silver halide grains. They can be chemically and spectrally sensitized in accordance with usual practices. Photographic print films typically use relatively small grain, high chloride emulsions (e.g., emulsions having average grain size equivalent circular diameters of less than about 1 micron and halide contents of greater than 50 mole % chloride) in order to optimize print image quality and enable rapid processing. Such emulsions typically result in relatively low speed photographic elements in comparison to camera negative films. Low speed is compensated for by the use of relatively high intensity print lamps or lasers for exposing such print elements. For comparison purposes, it is noted that motion picture color print films, e.g., when rated using the same international standards criteria used for rating camera negative films, would typically have an ISO speed rating of less than 10, which is several stops slower than the slowest camera negative films in current use. The emulsions typically will be gelatin emulsions although other hydrophilic colloids can be used in accordance with usual practice. The compositions of typical light sensitive image recording layers used in print films are well known, and are not critical to the invention, as any of the silver halide materials used in conventional motion picture films may be used, such as those described, e.g., in *Research Disclosure,* Item 36544, September, 1994, and the references listed therein.

Dye-image-providing materials can be incorporated in the silver halide emulsion layer or in a separate layer associated with the emulsion layer. The dye-image-providing material can be any of a number known in the art, such as dye-forming couplers, bleachable dyes, dye developers and redox dye-releasers, and the particular one employed will depend on the nature of the element, and the type of image desired. Dye-image-providing materials employed with conventional color materials designed for processing with separate solutions are preferably dye-forming couplers; i.e., compounds which couple with oxidized developing agent to form a dye. Preferred couplers which form cyan dye images are phenols and naphthols. Preferred couplers which form magenta dye images are pyrazolones and pyrazolotriazoles. Preferred couplers which form yellow dye images are benzoylacetanilides and pivaloylacetanilides.

In accordance with a preferred embodiment of this invention, an antihalation undercoat layer is present as part of a subbing layer unit between the support and the emulsion layers, and is used to prevent light from being reflected into the silver halide emulsion layer(s) and thereby causing an undesired spreading of the image which is known as halation. Any of the filter dyes known to the photographic art can be used in the present invention as a means of reducing halation. Thus, for example, water-soluble dyes can be used for this purpose. Such dyes should be incorporated in the antihalation undercoat with a mordant to prevent dye diffusion. Alternatively, and preferably, a solid particle filter dye is incorporated in the antihalation undercoat.

Useful water-soluble filter dyes include the pyrazolone oxonol dyes of U.S. Pat. No. 2,274,782, the solubilized diaryl azo dyes of U.S. Pat. No. 2,956,879, the solubilized styryl and butadienyl dyes of U.S. Pat. Nos. 3,423,207 and 3,384,487, the merocyanine dyes of U.S. Pat. No. 2,527,583, the merocyanine and oxonol dyes of U.S. Pat. Nos. 3,486,897; 3,652,284 and 3,718,472, the enamino hemioxonol dyes of U.S. Pat. No. 3,976,661, the cyanomethyl sulfone-derived merocyanines of U.S. Pat. No. 3,723,154, the thiazolidones, benzotriazoles, and thiazolothiazoles of U.S. Pat. Nos. 2,739,888; 3,253,921; 3,250,617 and 2,739,971, the triazoles of U.S. Pat. No. 3,004,896, and the hemioxonols of U.S. Pat. Nos. 3,125,597 and 4,045, 229. Useful mordants are described, for example, in U.S. Pat. Nos. 3,282,699; 3,455,693; 3,438,779 and 3,795,519.

Preferred examples of solid particle filter dyes for use in antihalation undercoat layers include those which are substantially insoluble at aqueous coating pH's of less than 7, and readily soluble or decolorizable in aqueous photographic processing solutions at pH of 8 or above, so as to be removed from or decolorized in a photographic element upon photographic processing. By substantially insoluble is meant dyes having a solubility of less than 1% by weight, preferably less than 0.1% by weight. Such dyes are generally of the formula:

$$D—(X)_n$$

where D represents a residue of a substantially insoluble compound having a chromophoric group, X represents a group having an ionizable proton bonded to D either directly or through a bivalent bonding group, and n is 1–7. The residue of a compound having a chromophoric group may be selected from conventional dye classes, including, e.g., oxonol dyes, merocyanine dyes, cyanine dyes, arylidene dyes, azomethine dyes, triphenylmethane dyes, azo dyes, and anthraquinone dyes. The group having an ionizable proton preferably has a pKa (acid dissociation constant) value measured in a mixed solvent of water and ethanol at 1:1 volume ratio within the range of 4 to 11, and may be, e.g., a carboxyl group, a sulfonamido group, a sulfamoyl group, a sulfonylcarbamoyl group, a carbonylsulfamoyl group, a hydroxy group, and the enol group of a oxonol dye or ammonium salts thereof. The filter dye should have a log P hydrophobicity parameter of from 0–6 in its non-ionized state. Such general class of ionizable filter dyes is well known in the photographic art, and includes, e.g., dyes disclosed for use in the form of aqueous solid particle dye dispersions as described in International Patent Publication WO 88/04794, European patent applications EP 594 973; EP 549 089; EP 546 163 and EP 430 180; U.S. Pat. Nos. 4,803,150; 4,855,221; 4,857,446; 4,900,652; 4,900,653; 4,940,654; 4,948,717; 4,948,718; 4,950,586; 4,988,611; 4,994,356; 5,098,820; 5,213,956; 5,260,179 and 5,266,454; the disclosures of each of which are herein incorporated by reference. Such dyes are generally described as being insoluble in aqueous solutions at pH below 7, and readily soluble or decolorizable in aqueous photographic processing solutions at pH 8 or above.

Preferred dyes of the above formula include those of formula:

$$[D—(A)_y]—X_n$$

where D, X and n are as defined above, and A is an aromatic ring bonded directly or indirectly to D, y is 0 to 4, and X is bonded either on A or an aromatic ring portion of D.

Exemplary dyes of the above formulas include those in Tables I to X of WO 88/04794, formulas (I) to (VII) of EP 0 456 163 A2, formula (II) of EP 0 594 973, and Tables I to XVI of U.S. Pat. No. 4,940,654 incorporated by reference above. Preferred examples of solid particle filter dyes include the following:

D-1

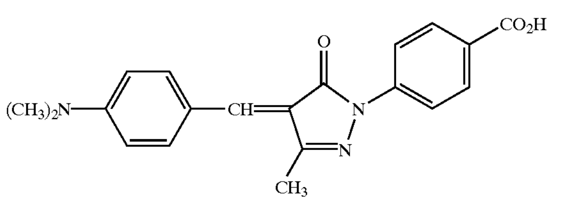

D-2

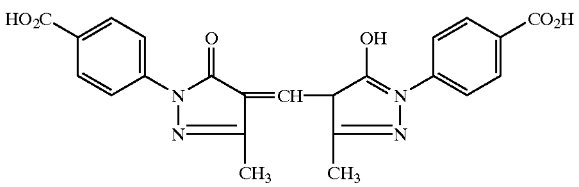

D-3

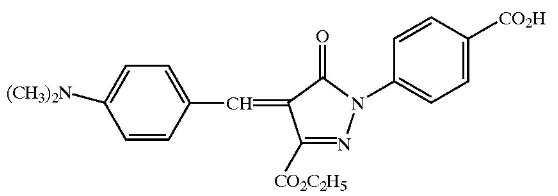

D-4

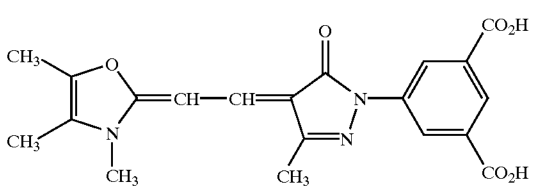

D-5

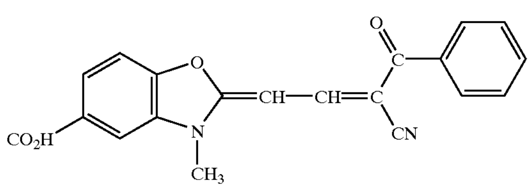

D-6

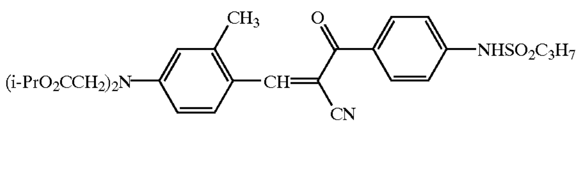

-continued

D-7

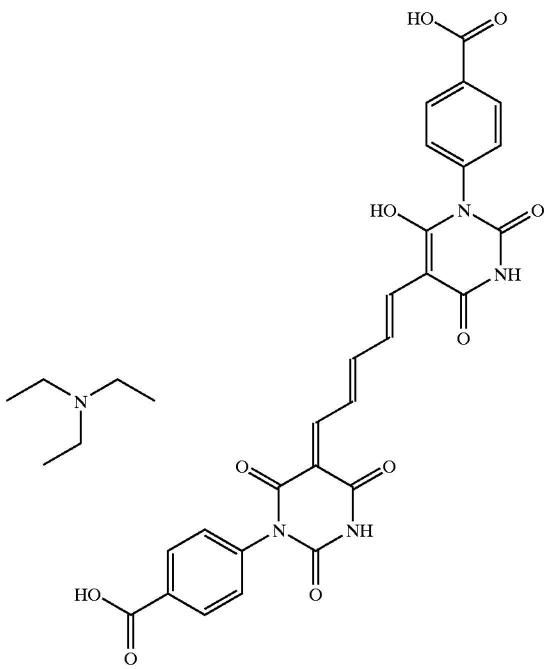

To promote adhesion of the antihalation undercoat to the support, primer layers as hereinabove described are advantageously employed, especially when the support is a polyester support.

The motion picture film elements processed in accordance with the present invention can contain additional auxiliary layers conventional in photographic elements, such as spacer layers, filter layers, pH lowering layers (sometimes referred to as acid layers and neutralizing layers), magnetic recording layers, timing layers, barrier layers, antistatic layers, and outermost protective overcoat and backcoat layers. The film elements can contain addenda conventional in the photographic art. Useful addenda are described, for example, in *Research Disclosure,* Item 36544, September, 1994. Useful addenda include spectral sensitizing dyes, desensitizers, antifoggants, masking couplers, DIR couplers, DIR compounds, antistain agents, image dye stabilizers, absorbing materials such as filter dyes and UV absorbers, light-scattering materials, coating aids, plasticizers and lubricants, and the like. To further improve laser subtitling performance or other print film properties, it is specifically contemplated that print films processed in accordance with the invention may incorporate anti-oxidant and UV absorbers as described in U.S. Pat. No. 5,981,155, the disclosure of which is incorporated by reference. Antioxidants in particular may be useful in combination with the invention.

Outermost protective overcoat and the outermost protective backcoat layers typically comprise film-forming binder and matting agent. The film-forming binder can be essentially any known polymeric binder. This includes hydrophilic colloids such as gelatin as well as hydrophobic polymers. Particularly preferred polymeric binders for use in the backcoat include aliphatic polyurethanes such as those described in U.S. Pat. No. 5,679,505 which is incorporated herein by reference.

In a particularly preferred embodiment the motion picture films processed in accordance with the invention may include an antistatic layer whose antistatic properties survive film processing. The antistatic layers may include a variety of electrically conductive metal-containing particles, such as metal oxides, dispersed in a binder material. Examples of useful electrically conductive metal-containing particles include donor-doped metal oxides, metal oxides containing oxygen deficiencies, and conductive nitrides, carbides, and borides. Specific examples of particularly useful particles include conductive $TiO_2$, $SnO_2$, $V_2O_5$, $Al_2O_3$, $ZrO_2$, $In_2O_3$, ZnO, $ZnSb_2O_6$, $InSbO_4$, $TiB_2$, $ZrB_2$, $NbB_2$, $TaB_2$, CrB, MoB, WB, $LaB_6$, ZrN, TiN, WC, HfC, HfN, and ZrC. Examples of the patents describing these electrically conductive particles include; U.S. Pat. Nos. 4,275,103; 4,394,441; 4,416,963; 4,418,141; 4,431,764; 4,495,276; 4,571,361; 4,999,276; 5,122,445 and 5,368,995. Other useful electrically conductive materials for use in antistatic layers include:

Semiconductive metal salts such as cuprous iodide as described in U.S. Pat. Nos. 3,245,833; 3,428,451 and 5,075,171.

Fibrous conductive powders comprising, for example, antimony-doped tin oxide coated onto non-conductive potassium titanate whiskers as described in U.S. Pat. Nos. 4,845,369 and 5,116,666.

Conductive polymers, such as, the cross-linked vinylbenzyl quaternary ammonium polymers of U.S. Pat. No. 4,070,189, the conductive polyanilines of U.S. Pat. No. 4,237,194, and conductive polythiophenes of U.S. Pat. Nos. 4,987,042, 5,035,926; 5,354,613; 5,370,981; 5,372,924; 5,543,944 and 5,766,515.

A colloidal gel of vanadium pentoxide or silver-doped vanadium pentoxide as described in U.S. Pat. Nos. 4,203,769; 5,006,451; 5,221,598 and 5,284,714.

Typically, the antistatic layer is coated at a dry coverage of from 1 to 1000 mg/m$^2$ based on total dry weight. The electrical resistivity of the antistatic layer is preferably from about 7 to about 11 log Ω/□, more preferably from about 8 to 11 log Ω/□, and most preferably from about 8.5 to 10 log Ω/□.

The antistatic layer may be present on either side or both sides of the support material. The antistatic layer may be an internal layer that underlies the antihalation undercoat, protective overcoat, protective backcoat or the emulsion layers. Alternatively, the antistatic layer may be an outermost layer in which the electrically conductive material is included in the protective overcoat or protective backcoat.

The following examples are intended to illustrate the present invention but not to limit it in scope in any way.

EXAMPLES

A multilayer motion picture color print film PF-1 employing silver bromochloride emulsions with an overall ratio of chloride to bromide of greater than 99:1 (individual emulsion bromide concentrations ranged from 0.3 to 1.7 mole percent) was prepared by coating the following layers in the following order on a gelatin subbed polyethylene terephthalate support. All units unless otherwise specified are in mg/m$^2$.

| Protective Overcoat | |
|---|---|
| Gelatin | 907 |
| Polydimethylsiloxane lubricant (Dow Corning) | 16 |
| Polymethylmethacrylate beads | 16 |
| Spreading Aids | |

-continued

| | |
|---|---|
| Green Emulsion Layer | |
| AgClBr cubic grain emulsion, 1.35% Br, 0.14 micron, spectrally sensitized with green sensitizing dye GSD-1, 0.363 mmole/Ag mole, and green sensitizing dye GSD-2, 0.012 mmole/Ag mole. | 73.5 |
| AgClBr cubic grain emulsion, 1.2% Br, 0.18 micron, spectrally sensitized with green sensitizing dye GSD-1, 0.293 mmole/Ag mole, and green sensitizing dye GSD-2, 0.009 mmole/Ag mole. | 343 |
| AgClBr cubic grain emulsion, 1.7% Br, 0.26 micron, spectrally sensitized with green sensitizing dye GSD-1, 0.273 mmole/Ag mole, and green sensitizing dye GSD-2, 0.008 mmole/Ag mole. | 73.5 |
| Magenta Dye Forming Coupler M-1 | 657 |
| Tricresyl phosphate | 140 |
| Green Filter Dye GFD-1 | 14 |
| Green Filter Dye GFD-2 | 32 |
| Oxidized Developer Scavenger Scav-1 | 12 |
| Gelatin | 1507 |
| Interlayer | |
| Oxidized Developer Scavenger Scav-1 | 86 |
| Gelatin | 610 |
| Spreading aids | |
| Red Emulsion Layer | |
| AgClBr cubic grain emulsion, 0.8% Br, 0.14 micron, spectrally sensitized with red sensitizing dye RSD-1, 0.042 mmole/Ag mole. | 117.5 |
| AgClBr cubic grain emulsion, 0.9% Br, 0.18 micron, spectrally sensitized with red sensitizing dye RSD-1, 0.044 mmole/Ag mole.. | 218.5 |
| AgClBr cubic grain emulsion, 0.9% Br, 0.26 micron, spectrally sensitized with red sensitizing dye RSD-1, 0.050 mmole/Ag mole | 70 |
| Cyan dye forming coupler C-1 | 888 |
| Dibutyl sebacate | 517 |
| Phenylethyl benzoate | 517 |
| Red Absorber Dye Pina TM Filter Blue Green (Riedel-de Haen Company) | 68 |
| Gelatin | 3122 |
| Interlayer | |
| Oxidized Developer Scavenger Scav-1 | 86 |
| Gelatin | 610 |
| Spreading Aids | |
| Blue Emulsion Layer | |
| AgClBr cubic grain emulsion, 0.4% Br, 0.40 micron, spectrally sensitized with blue sensitizing dye BSD-1, 0.151 mmole/Ag mole and blue sensitizing dye BSD-2, 0.149 mmole/Ag mole. | 259 |
| AgClBr cubic grain emulsion, 0.5% Br, 0.50 micron, spectrally sensitized with blue sensitizing dye BSD-1, 0.219 mmole/Ag mole and blue sensitizing dye BSD-2, 0.217 mmole/Ag mole. | 370 |
| AgClBr cubic grain emulsion, 0.3% Br, 0.90 micron, spectrally sensitized with blue sensitizing dye BSD-1, 0.124 mmole/Ag mole and blue sensitizing dye BSD-2, 0.122 mmole/Ag mole. | 167 |
| Yellow Coupler (Y-1) | 1290 |
| Blue filter dye BFD-1 | 31 |
| Ultraviolet absorber compound UV-1 | 190 |
| Metal Ion Sequestrant Seq-1 | 43 |
| Metal Ion Sequestrant Seq-2 | 22 |
| Yellow Preformed Dye YPD-1 | 8 |
| Gelatin | 2476 |
| Antihalation Layer | |
| Antihalation Filter Dye AFD-1 | 53 |
| Antihalation Filter Dye AFD-2 | 120 |
| Gelatin | 700 |
| Spreading aids | |
| Support | |

Transparent polyethylene terephthalate support with polyurethane overcoated vanadium pentoxide antistatic layer on the back of the film base which provides process surviving antistatic properties A second multilayer motion picture color print film PF-2 employing silver bromochloride and silver chloride emulsions with an overall higher (relative to PF-1) bromide concentration of 88:12 (individual emulsion bromide concentrations were 0 mole percent in the blue emulsion layer and 25 mole percent in the green and red emulsion layers) was similarly prepared by coating the sensitized, interlayer and overcoat layers as indicated in Example 101 of U.S. Pat. No. 5,888,706 on an Antihalation Layer and Support as indicated for film PF-1 above.

Samples of the print film elements were exposed for 1/500 second by means of a 3000 K Tungsten light source through a 0–3 neutral density step tablet, a heat-absorbing filter, and a filter designed to represent a motion picture color negative film. These samples were used to read the red, green, blue and visual Dmins after processing. In addition, samples for subtitling evaluation were prepared by printing a split screen image with high density and low density areas onto the print films with exposure controlled to create red, green, and blue densities after processing of approximately 0.2 over Dmin in the low density area and 2.0 over Dmin in the high density area.

After exposure, the samples were processed either through standard color print process ECP-2B as described in Kodak Publication H-24, Module 9, using the alternative 20" accelerator and a 40" persulfate bleach (designated as process “A” below), or a variation thereof (designated as processes “B” through “H” as indicated below), with the exception that those steps specific to sound track development were omitted in all cases.

Standard process “A” consisted of a prebath (10"), water rinse (20"), color developer (3'), stop bath (40"), first wash (40"), first fix (40"), second wash (40"), accelerator (20"), persulfate bleach (40"), third wash (40"), second fix (40"), fourth wash (1'), final rinse (10"), and then drying with hot air. Processing of the exposed elements was done with the color developing solution adjusted to 36.7° C. The stopping, fixing, bleaching, washing, and final rinsing solution temperatures were adjusted to 26.7° C.

For comparison process “B”, 0.5 g/l NaCl was added in the final rinse step.

For comparison process “C”, 1.0 g/l NaCl was added in the final rinse step.

For comparison process “D”, 1.0 g/l NaBr was added in the final rinse step.

For process “E”, the first fix step was omitted, and the second fix step was maintained at 40 seconds.

For process “F”, the first fix step was omitted, and the second fix step was shortened to 30 seconds.

For process “G”, the first fix step was omitted, and the second fix step was shortened to 20 seconds.

For process “H”, the bleach accelerator step was omitted.

The processed films are designated as either PF-1 or PF-2, followed by the processing designation A, B, C, D, E, F, G or H.

After processing, wavelength dispersive X-Ray Fluorescence (XRF) was used to measure the amount of silver retained in both the low and high optical density areas of the split screen images for samples PF-1-A, PF-1-E, PF-1-F, PF-1-G, PF-1-H, and PF-2-A. Since there is very little silver development in the low density area of the image, any remaining silver was associated with retained silver halide in this part. The amount of silver halide was calculated from the measured silver, the molecular weight of silver and silver halide, and for sample PF-2-A the ratio of chloride to bromide in the film emulsion formulations. Since film PF-1 is greater than 99:1 mole ratio silver chloride, the retained silver halide was assumed to be 100% silver chloride. Where the amount of silver measured in the high density areas was greater than the amount of silver in the low density areas, the difference between the two was assigned to be retained silver metal, as the amount of retained silver metal is known to generally increase with optical density. Results are reported in Table I below.

The chloride contents in standard processed film PF-1-A and comparison processed films PF-1-B, PF-1-C, and PF-1-D were also directly measured using XRF. This measurement includes all of the chloride in the sample, not just the chloride associated with the residual silver. Since there are a number of chloride-containing components in the film, the amount of chloride measured directly in standard processed film PF-1-A (Table II below) is much higher than the amount that would be calculated solely from the retained silver halide measurement of the same sample (Table I below). Note that the increase in residual chloride ion for samples PF-1-B, PF-1-C, and PF-1-D relative to standard processed sample PF-1-A was less than 10 $mg/m^2$.

Laser subtitling performance was evaluated by laser ablating (burning) text into the exposed and processed films with an Argon laser in a manner similar to that described in U.S. Pat. No. 5,367,348 to burn text images into both the low density and high density areas of the film. A scan rate and power setting was employed to generate an energy density at the film plane that is equivalent to that used in the trade. The representative text was a typical aspect ratio used for laser subtitling for motion picture projection. After the ablation process, the film was washed to remove debris created during the laser treatment process. The treated samples were then viewed in a small projection theater and qualitatively and comparatively visually rated from 1 to 5, with 1 being the best rating (indicating that the letters were wide and clean) and 5 the worst rating (indicating that the letters were very narrow, noisy, and difficult to read). Results are reported in Tables I and II.

The film elements were also evaluated for minimum density (Dmin), an important photographic characteristic that relates to the highlight areas of projected motion picture print images and that also impacts sound quality. The optical Red, Green, and Blue minimum density (Dmin) values, as well as the visual Dmin value, for each processed film was measured on a densitometer using filters in the densitometer appropriate to the intended use of the photographic element and are reported in Table III below. Typically acceptable Dmin levels for motion picture print films are in the range of 0.05 to 0.2 optical density.

TABLE I

| Sample | Deviations from Standard Process Treatment ECP2-B | Residual silver metal (Ag, $mg/m^2$) | Residual silver halide ($mg/m^2$) | Laser subtitling Rating |
|---|---|---|---|---|
| PF-1-A (Standard) | none | <11 | 30 (AgCl) | 3 |
| PF-1-E (Invention) | No first fix, standard (40") second fix | <11 | 180 (AgCl) | 1 |
| PF-1-F (Invention) | No first fix, shortened (30") second fix | <11 | 285 (AgCl) | 2 |
| PF-1-G (Invention) | No first fix, shortened (20") second fix | <11 | 375 (AgCl) | 2 |
| PF-1-H (Invention) | No bleach accelerator | 947 | 195 (AgCl) | 2 |
| PF-2-A (Standard) | none | <11 | 39 (AgCl) 7 (AgBr) | 4 |

TABLE II

| Sample | Deviations from Standard Process Treatment ECP-2B | Residual Bromide (XRF), ($mg/m^2$) | Residual Chloride (XRF), ($mg/m^2$) | Laser subtitling Rating |
|---|---|---|---|---|
| PF-1-A (Standard) | none | <6 | 262 | 3 |
| PF-1-B (Comparison) | 0.5 g/l NaCl in final rinse | <6 | 267 | 3 |
| PF-1-C (Comparison) | 1.0 g/l NaCl in Final Rinse | <6 | 271 | 3 |
| PF-1-D (Comparison) | 1.0 g/l NaBr in Final Rinse | 17 | 262 | 3 |

TABLE III

| Sample | Deviations from Standard Process Treatment ECP2-B | Red Dmin | Green Dmin | Blue Dmin | Visual Dmin |
|---|---|---|---|---|---|
| PF-1-A (Standard) | none | 0.059 | 0.067 | 0.14 | 0.060 |
| PF-1-B (Comparison) | 0.5 g/l NaCl in final rinse | 0.058 | 0.057 | 0.14 | 0.057 |
| PF-1-C (Comparison) | 1.0 g/l NaCl in Final Rinse | 0.058 | 0.059 | 0.14 | 0.058 |
| PF-1-D (Comparison) | 1.0 g/l NaBr in Final Rinse | 0.055 | 0.059 | 0.15 | 0.058 |
| PF-1-E (Invention) | No first fix 40" second fix | 0.058 | 0.072 | 0.18 | 0.062 |
| PF-1-F (Invention) | No first fix 30" second fix | 0.061 | 0.082 | 0.21 | 0.068 |
| PF-1-G (Invention) | No first fix 20" second fix | 0.075 | 0.101 | 0.27 | 0.085 |
| PF-1-H (Invention) | No bleach accelerator | 0.061 | 0.072 | 0.14 | 0.063 |
| PF-2-A (Standard) | none | 0.060 | 0.073 | 0.15 | 0.069 |

In every case in which process variations were used to retain silver halide in the film the laser subtitling was substantially improved. A comparison of invention samples PF-1-B and PF-1-H demonstrates that while still showing an improvement, retaining silver metal in combination with residual silver halide appears to prevent the entire benefit of the retained silver halide from being realized. When added to the processing solution as part of the final rinse, additional bromide and chloride ions alone had no effect on the ability to subtitle the film. The above results are contrary to what is suggested in U. S. Pat. No. 5,981,155, which states that halide ion in a print film degrades the ability of the film to be subtitled, highlighting the unobviousness of the present invention. Finally, comparison PF-2-A demonstrates that merely decreasing ratio of chloride to bromide in the formulation is not sufficient to improve laser subtitling of a print film.

The following structures represent compounds utilized in the above described photographic elements.

GSD-1
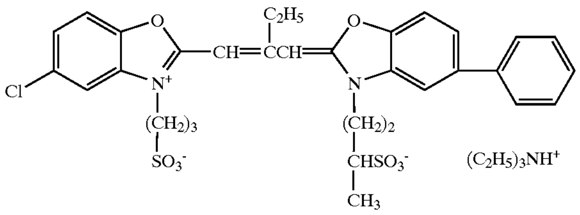
Green sensitizing dye
GSD-2
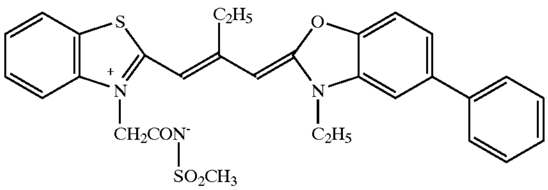
Green sensitizing dye
M-1
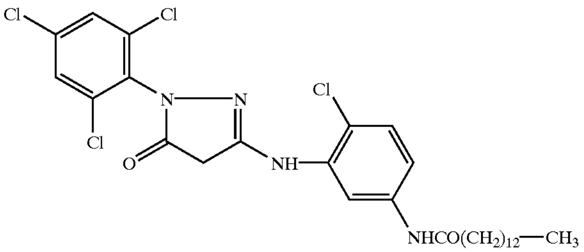
Magenta coupler
GFD-1
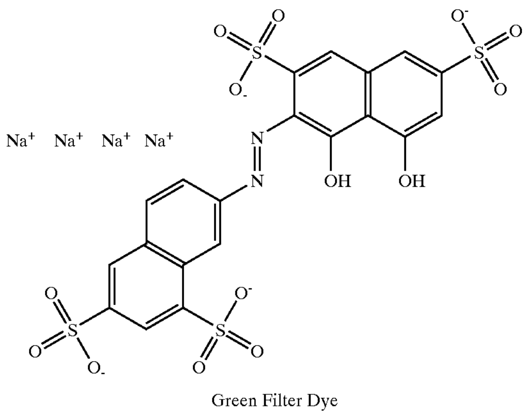
Green Filter Dye
-continued
GFD-2
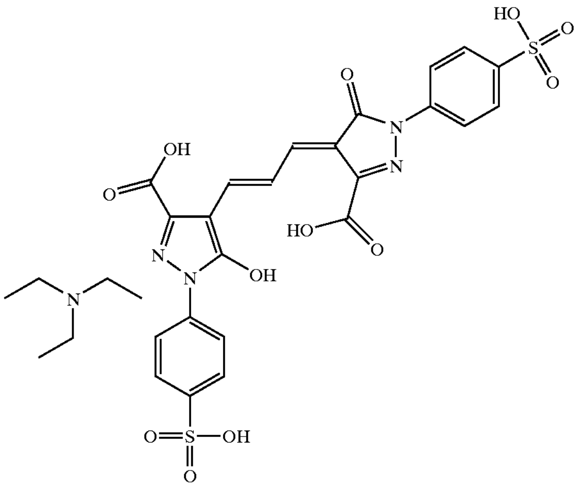
Green Filter Dye
Scav-1
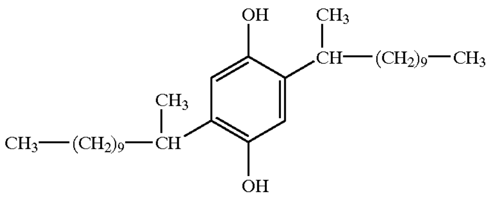
Scavenger
YPD-1
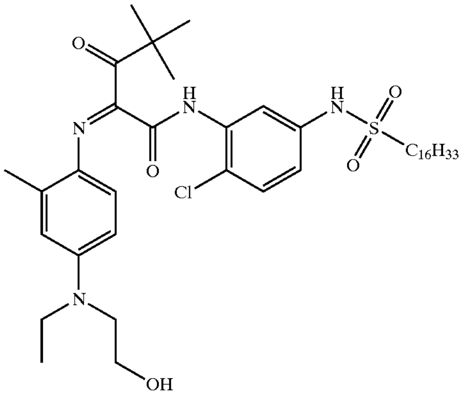
Yellow Prerformed Dye
RSD-1
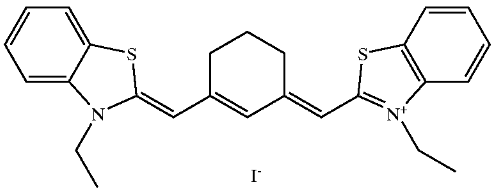
Red sensitizing dye -continued
C-1
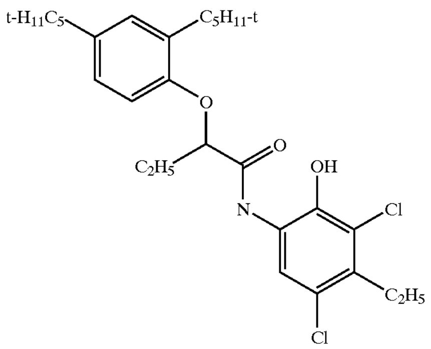
Cyan coupler
BSD-1
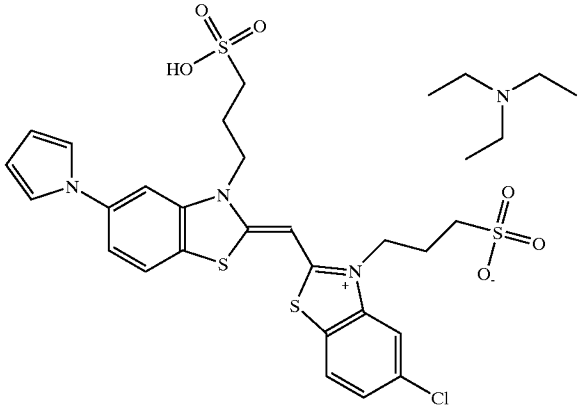
Blue sensitizing dye
BSD-2
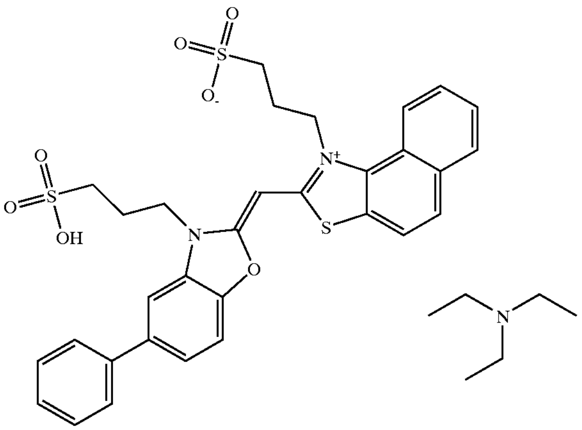
Blue sensitizing dye
Y-1
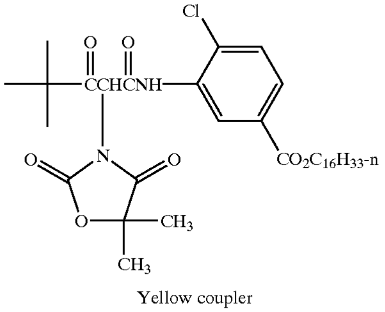
Yellow coupler
-continued
BFD-1
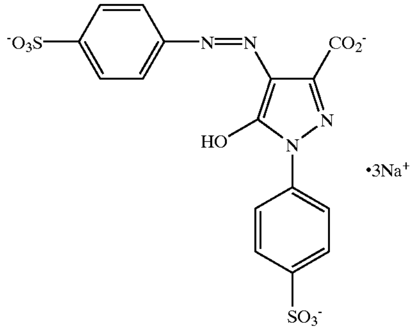
Blue filter dye
Seq-1
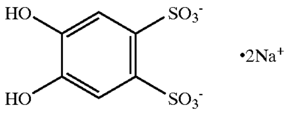
Sequestrant
Seq-2
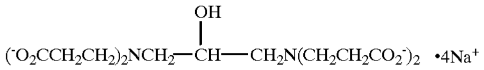
Sequestrant
AFD-1
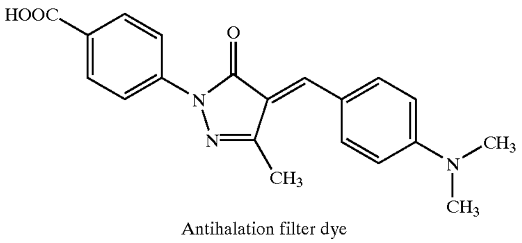
Antihalation filter dye
AFD-2
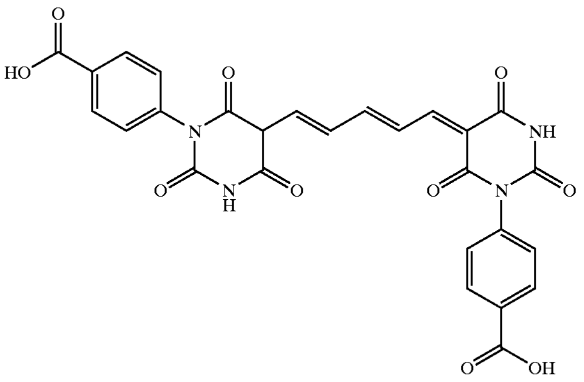
Antihalation filter dye -continued

UV-1

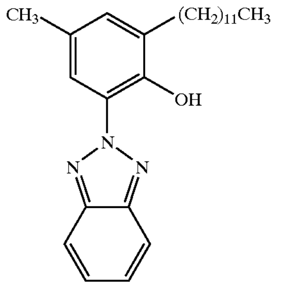

While the invention has been described in detail with particular reference to preferred embodiments, it will be understood that variations and modifications can be effected within the spirit and scope of the invention.

What is claimed:

1. A method for processing and laser ablation marking an imagewise exposed motion picture photographic film element which comprises a support having on a front side thereof one or more image-forming units comprising at least one light-sensitive silver halide emulsion layer, comprising processing the film to provide a developed photographic image with at least 100 $mg/m^2$ of retained silver halide, and subsequently laser ablation marking the film to selectively ablate portions of the image forming units from the support.

2. A method according to claim 1, wherein the film is processed to provide a developed photographic image with from 100 to 1000 $mg/m^2$ of retained silver halide.

3. A method according to claim 1, wherein the film is processed to provide a developed photographic image with from 100 to 500 $mg/m^2$ of retained silver halide.

4. A method according to claim 1, wherein the film is processed to provide a developed photographic image with from 100 to 250 $mg/m^2$ of retained silver halide.

5. A method according to claim 1, wherein the film element comprises yellow, magenta, and cyan dye image-forming units comprising light-sensitive silver halide emulsion layers coated on the support.

6. A method according to claim 5, wherein film element includes an antihalation undercoat between the support and the emulsion layers.

7. A method according to claim 1, wherein the film element includes an antihalation undercoat between the support and the emulsion layer.

8. A method according to claim 1, wherein the film element comprises a color motion picture print film element comprising a support having on a front side thereof, in order, a yellow dye image-forming unit comprising at least one blue-sensitive silver halide emulsion layer having associated therewith at least one yellow dye-forming coupler, a cyan dye image-forming unit comprising at least one red-sensitive silver halide emulsion layer having associated therewith at least one cyan dye-forming coupler, and a magenta dye image-forming unit comprising at least one green-sensitive silver halide emulsion layer having associated therewith at least one magenta dye-forming coupler.

9. A method according to claim 8, wherein the film element includes an antihalation undercoat between the support and the emulsion layers.

10. A method according to claim 8, wherein the film is processed to provide retained silver metal level after photographic processing of less than 500 $mg/m^2$.

11. A method according to claim 8, wherein the film is processed to provide retained silver metal level after photographic processing of less than 100 $mg/m^2$.

12. A method according to claim 8, wherein the film element comprises a polyester film support.

* * * * *